(12) United States Patent
Osanai et al.

(10) Patent No.: US 7,189,449 B2
(45) Date of Patent: *Mar. 13, 2007

(54) METAL/CERAMIC BONDING SUBSTRATE AND METHOD FOR PRODUCING SAME

(75) Inventors: Hideyo Osanai, Shiojiri (JP); Takayuki Takahashi, Shiojiri (JP); Makoto Namioka, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/964,426

(22) Filed: Oct. 12, 2004

(65) Prior Publication Data
US 2005/0079329 A1   Apr. 14, 2005

(30) Foreign Application Priority Data
Oct. 10, 2003   (JP)   ............... 2003-351936

(51) Int. Cl.
*B32B 3/00* (2006.01)
*H01L 23/24* (2006.01)

(52) U.S. Cl. ............... 428/210; 428/209; 257/706; 257/712; 257/713; 257/720; 257/729; 257/730

(58) Field of Classification Search ........ 428/209–210; 257/706, 712–713, 720, 729–730
See application file for complete search history.

(56) References Cited

U.S. PATENT DOCUMENTS

| | | | | | |
|---|---|---|---|---|---|
| 4,248,948 | A | * | 2/1981 | Matsuda | .................. 430/5 |
| 5,213,877 | A | * | 5/1993 | Yoshida et al. | ............. 428/209 |
| 5,602,720 | A | * | 2/1997 | Natsuhara et al. | .......... 361/708 |
| 5,807,626 | A | * | 9/1998 | Naba | ........................ 428/210 |
| 6,294,244 | B1 | * | 9/2001 | Iwaida et al. | ............... 428/209 |
| 6,309,737 | B1 | * | 10/2001 | Hirashima et al. | .......... 428/210 |

FOREIGN PATENT DOCUMENTS

JP   2002-76551   3/2002

* cited by examiner

*Primary Examiner*—Cathy F. Lam
(74) *Attorney, Agent, or Firm*—Bachman & LaPointe, P.C.

(57) ABSTRACT

In a metal/ceramic bonding substrate 10 wherein a circuit forming metal plate 14 is bonded to one side of a ceramic substrate 12 and a radiating metal base plate 16 is bonded to the other side thereof, a difference in level is provided along the entire circumference of the bonding surface of the ceramic substrate 12 to the metal base plate 16. The difference in level is provided by forming at least one of a rising portion 16a and a groove portion 116b on and in the metal base plate 16.

18 Claims, 8 Drawing Sheets

METAL/CERAMIC BONDING SUBSTRATE AND METHOD FOR PRODUCING SAME

BACKGROUND OF THE INVENTION

1. Field of the Invention

The present invention generally relates to a metal/ceramic bonding substrate and a method for producing the same. More specifically, the invention relates to a metal/ceramic bonding substrate wherein a circuit forming metal plate is bonded to one side of a ceramic substrate and a radiating metal base plate is bonded to the other side thereof, and a method for producing the same.

2. Description of the Prior Art

In recent years, as an insulating substrate for a power module for controlling heavy-current for electric vehicles, electric railcars, machine tools and so forth, there is used a metal/ceramic bonding substrate wherein a metal circuit plate is bonded to a ceramic substrate and a flat-plate-shaped radiating metal base plate is bonded to the other side thereof (see, e.g., Japanese Patent Laid-Open No. 2002-76551).

However, in order to increase the insulation distance of conventional metal/ceramic bonding substrates to improve reliability on insulation thereof, it is required to increase the distance between a metal circuit plate and a metal base plate, so that it is required to increase the size of the metal/ceramic bonding substrate. In addition, the reliability of conventional metal/ceramic bonding substrates to heat cycles is not always sufficient.

SUMMARY OF THE INVENTION

It is therefore an object of the present invention to eliminate the aforementioned problems and to provide a metal/ceramic bonding substrate having improved reliability on insulation and reliability to heat cycles, by increasing the insulation distance of the metal/ceramic bonding substrate without increasing the size of the metal/ceramic bonding substrate, and a method for producing the same.

In order to accomplish the aforementioned and other objects, the inventor has diligently studied and found that, if a difference in level is provided along the circumference of the bonding surface of a ceramic substrate to a metal base member in a metal/ceramic bonding substrate wherein a metal plate is bonded to one side of the ceramic substrate and the metal base plate is bonded to the other side thereof, it is possible to improve reliability on insulation and reliability to heat cycles. Thus, the inventor has made the present invention.

According to one aspect of the present invention, a metal/ceramic bonding substrate comprises: a ceramic substrate; a metal plate bonded to one side of the ceramic substrate; and a metal base member bonded to the other side of the ceramic substrate, wherein a difference in level is provided along the circumference of a bonding surface of the ceramic substrate to the metal base member.

In this metal/ceramic bonding substrate as set, the difference in level is preferably provided along the entire circumference of the bonding surface. The difference in level maybe provided by forming a rising portion on the metal base plate, the rising portion rising toward the other side of the ceramic substrate to be bonded to the other side of the ceramic substrate. Alternatively, the difference in level may be provided by forming a groove portion in the metal base plate, the groove portion extending along an outer peripheral portion of the other side of the ceramic substrate. Alternatively, the difference in level may be provided by forming a rising portion on the metal base member and forming a groove portion in the metal base member, the rising portion rising toward the other side of the ceramic substrate to be bonded to the other side of the ceramic substrate, the groove portion extending around the rising portion. The rising portion may rise in a direction substantially perpendicular to the ceramic substrate, or may rise at an acute angle with respect to the ceramic substrate.

According to another aspect of the present invention, a metal/ceramic bonding substrate comprises: a ceramic substrate; a metal plate bonded to one side of the ceramic substrate; and a metal base member comprising a flat plate portion and a rising portion which rises from the flat plate portion to be bonded to the other side of the ceramic substrate. In this metal/ceramic bonding substrate, the rising portion may rise from the flat plate portion in a direction substantially perpendicular thereto, or may rise at an acute angle with respect to the ceramic substrate.

According to another aspect of the present invention, a metal/ceramic bonding substrate comprises: a ceramic substrate; a metal plate bonded to one side of the ceramic substrate; and a metal base member bonded to the other side of the ceramic substrate, the metal base member having a groove portion which extends along an outer peripheral portion of the other side of the ceramic substrate. In this metal/ceramic bonding substrate, the groove portion preferably extends along the entire periphery of the ceramic substrate.

According to a further aspect of the present invention, a metal/ceramic bonding substrate comprises: a ceramic substrate; a metal plate bonded to one side of the ceramic substrate; and a metal base member comprising a flat plate portion and a rising portion which rises from the flat plate portion to be bonded to the other side of the ceramic substrate, the metal base member having a groove portion which extends around the rising portion. In this metal/ceramic bonding substrate, the groove portion preferably extends so as to surround the entire periphery of the rising portion. The rising portion may rise from the flat plate portion in a direction substantially perpendicular thereto, or may rise at an acute angle with respect to the ceramic substrate.

According to a still further aspect of the present invention, there is provided a method for producing a metal/ceramic bonding substrate, the method comprising the steps of: bonding a metal plate to one side of a ceramic substrate while bonding a metal base member to the other side thereof; and causing one side of the metal base member to have a difference in level so that the difference in level is arranged along the circumference of a bonding surface of the ceramic substrate to the metal base member.

In this method for producing a metal/ceramic bonding substrate, the difference in level is preferably arranged along the entire circumference of the bonding surface. The difference in level may be provided by forming a rising portion on the metal base plate, the rising portion rising toward the other side of the ceramic substrate to be bonded to the other side of the ceramic substrate. Alternatively, the difference in level maybe provided by forming a groove portion in the metal base plate, the groove portion extending along an outer peripheral portion of the other side of the ceramic substrate. Alternatively, the difference in level may be provided by forming a rising portion on the metal base member and forming a groove portion in the metal base member, the rising portion rising toward the other side of the ceramic substrate to be bonded to the other side of the ceramic substrate, the groove portion extending around the rising portion. The groove portion may be formed by forming a resist on the substantially entire surface of the metal base member, except for a portion near a peripheral portion of the ceramic substrate, to etch the metal base member after the metal plate and the metal base member are bonded to the ceramic substrate. At least one of the metal plate and the metal base member may be bonded to the ceramic substrate by solidifying a molten metal injected into a mold.

According to the present invention, it is possible to improve reliability on insulation and reliability to heat cycles by providing a difference in level along the circumference of the bonding surface of a ceramic substrate to a metal base member in a metal/ceramic bonding substrate wherein a metal member is bonded to one side of the ceramic substrate and the metal base member is bonded to the other side thereof.

Since the insulation distance of a metal/ceramic bonding substrate according to the present invention can be decreased while maintaining the withstand voltage thereof, it is possible to reduce the size and costs of parts. Moreover, in comparison with conventional metal/ceramic bonding substrates, it is possible to effectively inhibit cracks from being produced in the metal base member after heat cycles, so that it is possible to prevent heat sink characteristics from being deteriorated by the production of cracks.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

In the preferred embodiments of a metal/ceramic bonding substrate according to the present invention wherein a circuit forming metal plate is bonded to one side of a ceramic substrate and a radiating metal base plate is bonded to the other side thereof, a difference in level is provided along the circumference of the whole periphery of the bonding surface of the ceramic substrate to the metal base plate.

Furthermore, the ceramic substrate preferably contains AlN, $Al_2O_3$, $Si_3N_4$ or SiC as a principal component and has a thickness of about 0.2 to 1.0 mm. As the thickness of the ceramic substrate decreases, the function of improving the withstand voltage and heat cycle resistance of the metal/ceramic bonding substrate decreases. The metal plate is preferably made of aluminum, copper or an alloy thereof in view of electric characteristics and thermal conductivity.

Referring now to the accompanying drawings, the first through fifth preferred embodiments of a metal/ceramic bonding substrate and a method for producing the same according to the present invention will be described below in detail.

[First Preferred Embodiment]

Figure 1A:
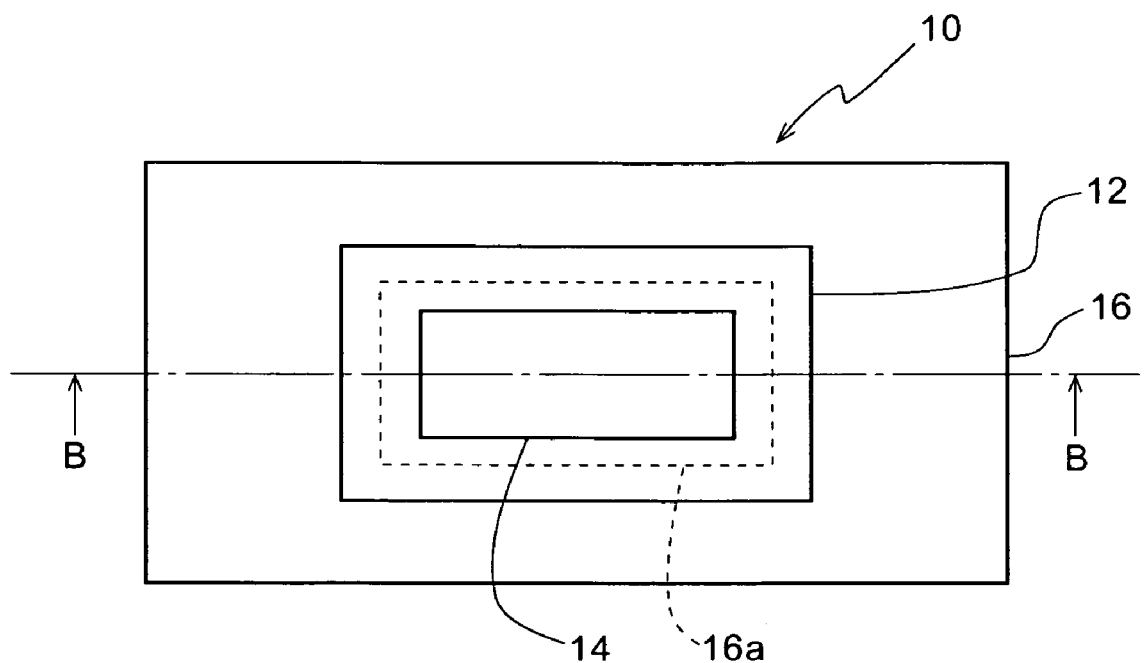
FIG. 1A is a plan view of the first preferred embodiment of a metal/ceramic bonding substrate according to the present invention.
Figure 1B:
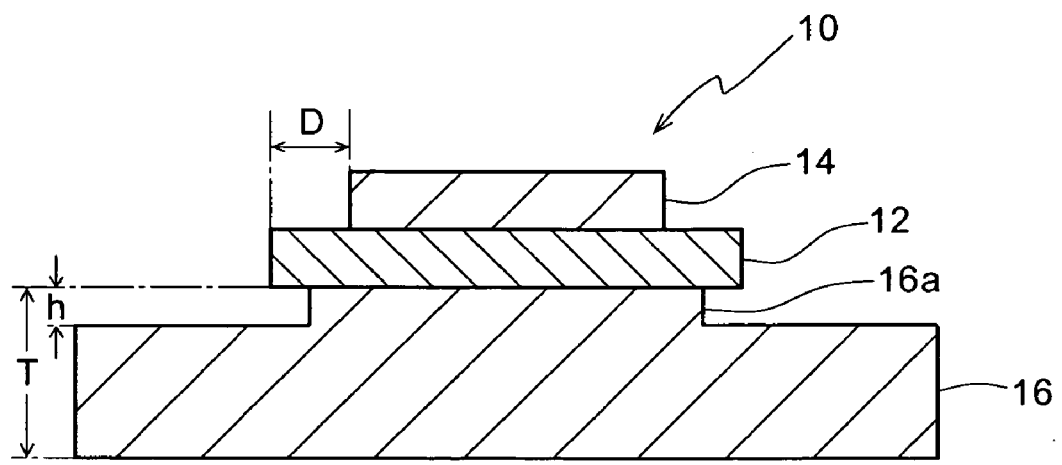
FIG. 1B is a sectional view taken along line B—B of FIG. 1A.

FIGS. 1A and 1B show the first preferred embodiment of a metal/ceramic bonding substrate according to the present invention. As shown in FIGS. 1A and 1B, the metal/ceramic bonding substrate 10 in this preferred embodiment comprises a substantially rectangular flat-plate-shaped ceramic substrate 12, at least one (only one is shown in FIGS. 1A and 1B) substantially rectangular flat-plate-shaped circuit forming metal plate 14 which is bonded to one side of the ceramic substrate 12 and which is smaller than the ceramic substrate 12, and a radiating metal base plate 16 (thickness T) which is bonded to the other side of the ceramic substrate 12 and which has a substantially rectangular planar shape. In this preferred embodiment, the metal base plate 16 has a rising portion 16a which rises by a predetermined height h from a surface thereof facing the ceramic substrate 12 in a direction substantially perpendicular thereto and which has a substantially rectangular planar shape smaller than that of the ceramic substrate 12. To the top face of the rising portion 16a, the ceramic substrate 12 is bonded. With this construction, a difference in level is provided along the entire circumference of the bonding surface of the ceramic substrate 12 to the metal base plate 16.

Figure 2:
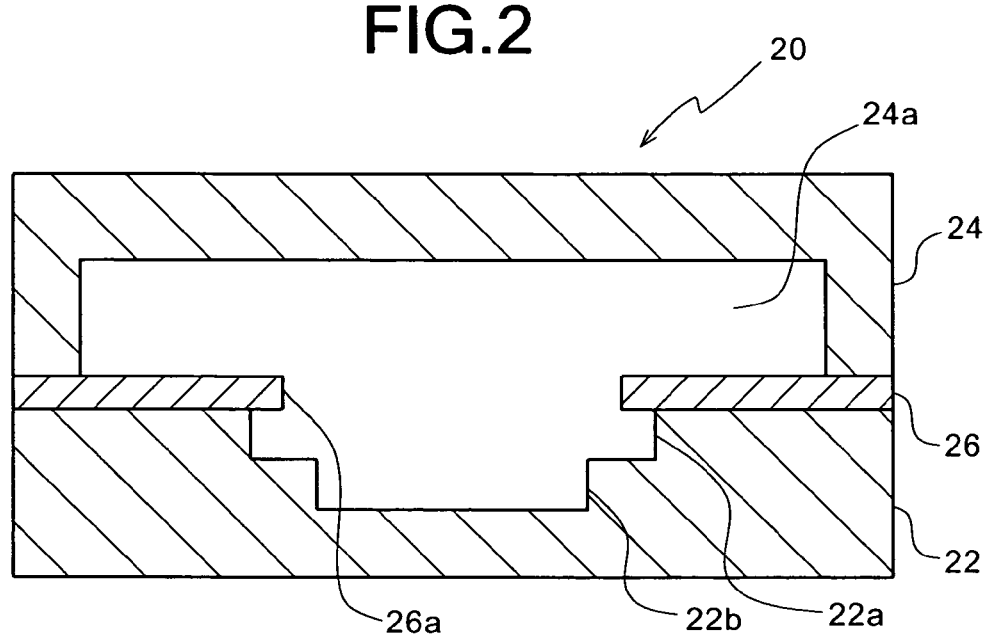
FIG. 2 is a sectional view of a mold used for producing the metal/ceramic bonding substrate of FIGS. 1A and 1B.
Figure 3:
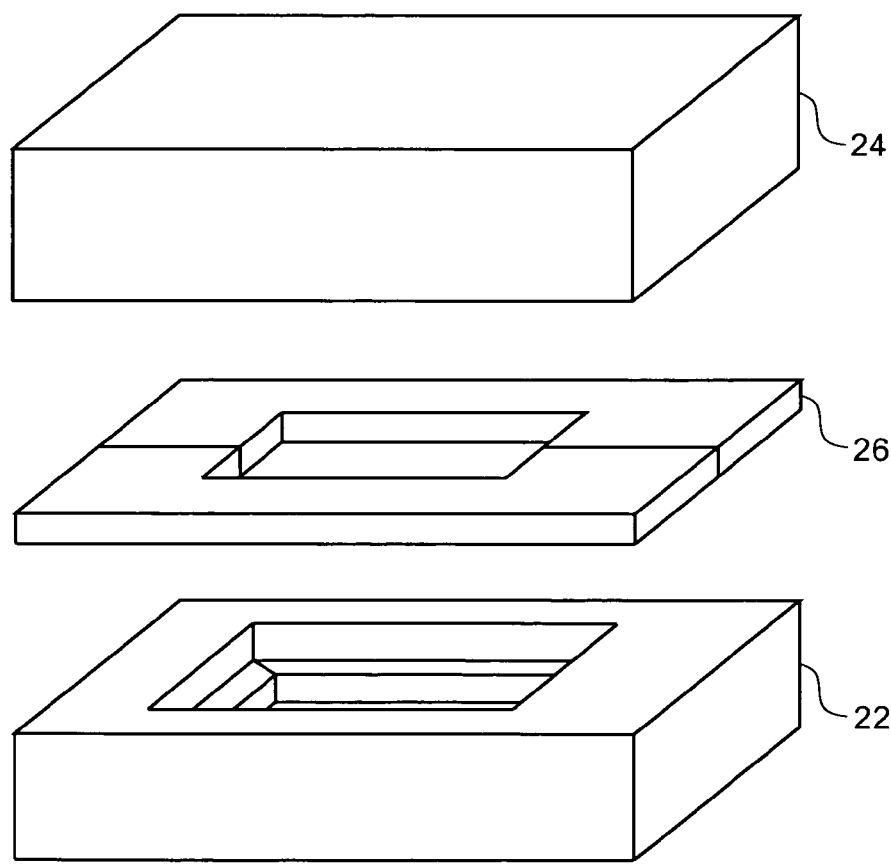
FIG. 3 is an exploded perspective view of the mold of FIG. 2 before it is assembled.

The metal/ceramic bonding substrate 10 in this preferred embodiment may be produced by, e.g., a method comprising the steps of: preparing a mold 20 shown in FIGS. 2 and 3; arranging the ceramic substrate 12 in the mold 20; injecting a molten metal into the mold 20 so as to contact both sides of the ceramic substrate 12; and thereafter, cooling and solidifying the molten metal to bond the circuit forming metal plate 14 to one side of the ceramic substrate 12 and to bond the radiating metal base plate 16 to the other side thereof.

As shown in FIGS. 2 and 3, the mold 20 comprises lower and upper mold members 22 and 24 which have a substantially rectangular planar shape and which are preferably made of a gas permeable material, such as carbon or a porous metal, and an intermediate mold member 26 of a metal material which is arranged between the lower and upper mold members 22 and 24 and which has a substantially rectangular planar shape. In a substantially central portion of the top face of the lower mold member 22, there is formed a recessed portion serving as a ceramic substrate holding portion 22a which substantially has the same shape and size as those of the ceramic substrate 12. In a substantially central portion of the bottom of the ceramic substrate holding portion 22a, there is formed a recessed portion serving as a metal circuit plate forming portion 22b which substantially has the same shape and size as those of the circuit forming metal plate 14. The intermediate mold member 26 comprises two pieces for allowing the metal/ceramic bonding substrate 10 to be taken out of the mold, and has such a shape that a through hole serving as a rising portion forming portion 26a, which substantially has the same shape and size as those of the rising portion 16a, is formed in the substantially central portion when the two pieces are aligned with each other. Although the intermediate mold member 26 is preferably formed of a metal material in view of strength, it may be made of the same carbon or porous metal as that of the lower mold member 22. In the upper mold member 24, there is formed a metal base plate forming portion 24a which substantially has the same shape and size as those of a portion of the radiating metal base plate 16 other than the rising portion 16a. Furthermore, a molten metal inlet (not shown) for injecting a molten metal into the mold 20 is formed in the upper mold member 24. In the intermediate mold member 26 and lower mold member 22, a molten metal passage (not shown) extending between the metal base plate forming portion 24a and the metal circuit plate forming portion 22b is formed so as to allow the metal base plate forming portion 24a to be communicated with the metal circuit plate forming portion 22b if the ceramic substrate 12 is housed in the ceramic substrate housing portion 22a.

After the ceramic substrate 12 is housed in the ceramic substrate holding portion 22a of the lower mold member 22 of the mold 20, the intermediate mold member 26 is arranged on the lower mold member 22, and the upper mold member 24 is arranged thereon to be fixed. Thereafter, a molten metal, such as molten aluminum, is injected into the metal base plate forming portion 24a to be filled in the metal circuit plate forming portion 22b via the molten metal passage. Then, the molten metal is cooled to be solidified to obtain a metal/ceramic bonding substrate 10 wherein the circuit forming metal plate 14 is bonded directly to one side of the ceramic substrate 12 and the radiating metal base plate 16 is bonded directly to the other side thereof, as shown in FIGS. 1A and 1B. Thereafter, a resist having a shape of a predetermined circuit pattern is formed on the top face of the circuit forming metal plate 14 to etch the circuit forming metal plate 14 to form a metal circuit plate having the predetermined circuit pattern.

[Second Preferred Embodiment]

Figure 4:
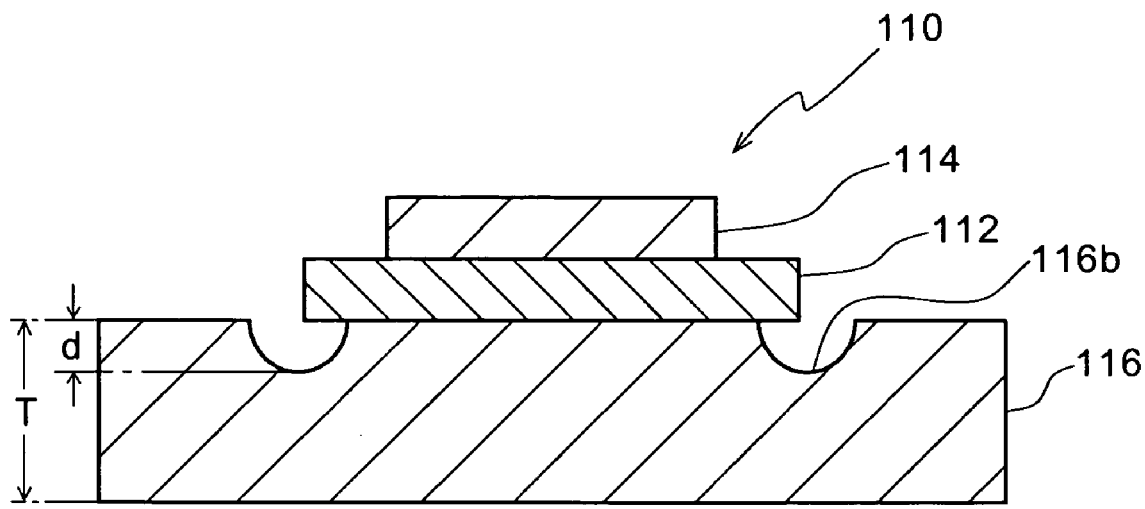
FIG. 4 is a sectional view of the second preferred embodiment of a metal/ceramic bonding substrate according to the present invention.

FIG. 4 shows the second preferred embodiment of a metal/ceramic bonding substrate according to the present invention. As shown in FIG. 4, the metal/ceramic bonding substrate 110 in this preferred embodiment comprises a substantially rectangular flat-plate-shaped ceramic substrate 112, at least one (only one is shown in FIG. 4) substantially rectangular flat-plate-shaped circuit forming metal plate 114 which is bonded to one side of the ceramic substrate 112 and which is smaller than the ceramic substrate 112, and a radiating metal base plate 116 (thickness T) which is bonded to the other side of the ceramic substrate 112 and which has a substantially rectangular planar shape. In this preferred embodiment, the top face of the metal base plate 116 has a groove portion 116a which extends along the outer periphery of the ceramic substrate 112 and which has a depth d, and the ceramic substrate 112 is bonded to a portion of the top face of the metal base plate 116 surrounded by the groove portion 116b. The groove portion 116b is formed so as to straddle the outer periphery of the ceramic substrate 112, so that the area of the bonding surface of the ceramic substrate 112 to the metal base plate 116 is smaller than the area of the ceramic substrate 112. With this construction, a difference in level is provided along the entire circumference of the bonding surface of the ceramic substrate 112 to the metal base plate 116.

Figure 5:
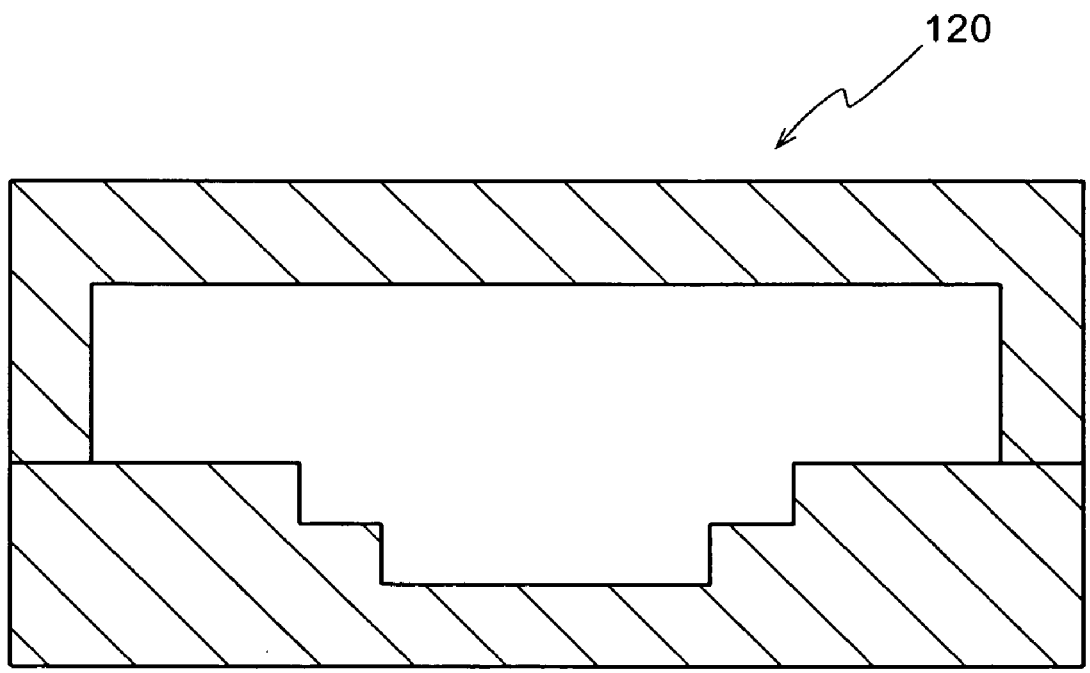
FIG. 5 is a sectional view of a mold used for producing the metal/ceramic bonding substrate of FIG. 4.
Figure 6:
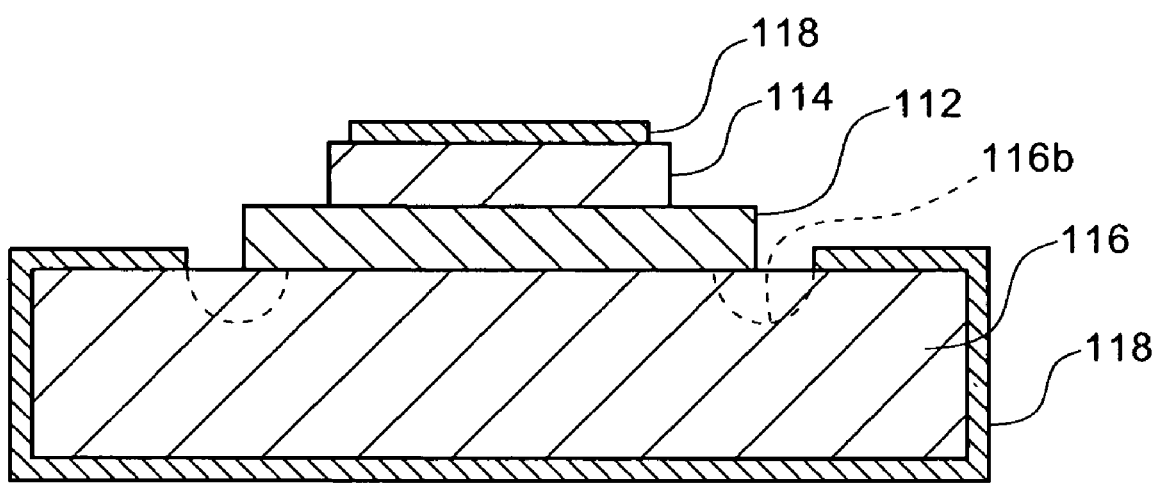
FIG. 6 is a sectional view showing a state that resists are formed for producing the metal/ceramic bonding substrate of FIG. 4.

The metal/ceramic bonding substrate 110 in this preferred embodiment may be produced by, e.g., a method comprising the steps of: preparing a mold 120 shown in FIG. 5, which is the same as the mold 20 used in the first preferred embodiment except that the intermediate mold member 26 is not provided; arranging the ceramic substrate 112 in the mold 120; injecting a molten metal into the mold 120 so as to contact both sides of the ceramic substrate 112; cooling and solidifying the molten metal to bond the circuit forming metal plate 114 to one side of the ceramic substrate 112 and to bond the radiating metal base plate 116 to the other side thereof; forming a resist 118 having a shape of a predetermined pattern on the top face of the circuit forming metal plate 114, and a resist 118 on the substantially entire surface of the metal base plate 116 except for a portion near the peripheral portion of the ceramic substrate 112, as shown in FIG. 6; and thereafter, etching the circuit forming metal plate 114 and the metal base plate 116 to form the groove portion 116b in the metal base plate 116.

[Third Preferred Embodiment]

Figure 7:
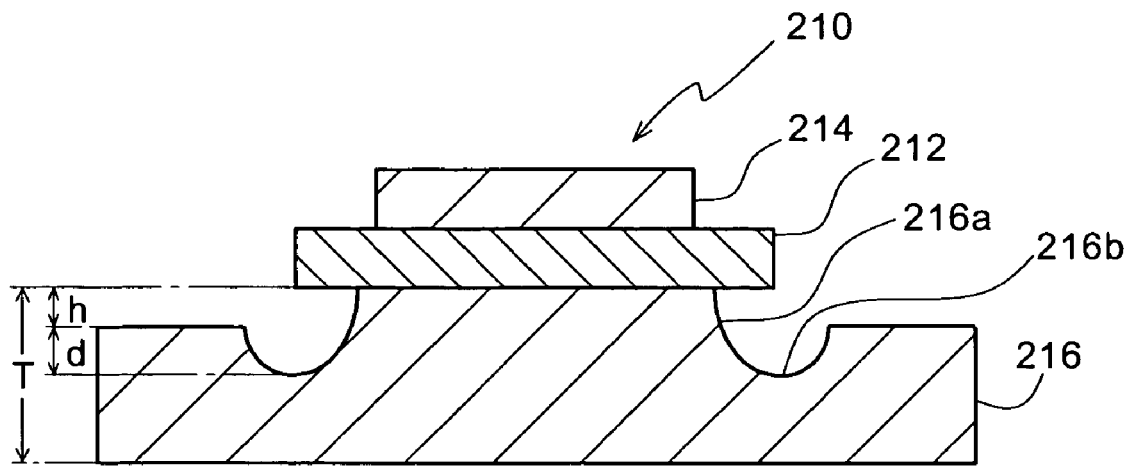
FIG. 7 is a sectional view of the third preferred embodiment of a metal/ceramic bonding substrate according to the present invention;.

FIG. 7 shows the third preferred embodiment of a metal/ceramic bonding substrate according to the present invention. As shown in FIG. 7, the metal/ceramic bonding substrate 210 in this preferred embodiment has such a shape that the metal/ceramic bonding substrate 10 in the first preferred embodiment is combined with the metal/ceramic bonding substrate 110 in the second preferred embodiment, and comprises a substantially rectangular flat-plate-shaped ceramic substrate 212, at least one (only one is shown in FIG. 7) substantially rectangular flat-plate-shaped circuit forming metal plate 214 which is bonded to one side of the ceramic substrate 212 and which is smaller than the ceramic substrate 212, and a radiating metal base plate 216 (thickness T) which is bonded to the other side of the ceramic substrate 212 and which has a substantially rectangular planar shape. In this preferred embodiment, the metal base plate 216 has a rising portion 216a which rises by a predetermined height h from a surface thereof facing the ceramic substrate 212 in a direction substantially perpendicular thereto and which has a substantially rectangular planar shape smaller than that of the ceramic substrate 212, and a groove portion 216a which extends so as to surround the rising portion 216a and which has a depth d. To the top face of the rising portion 216a, the ceramic substrate 212 is bonded. With this construction, a difference in level is provided along the entire circumference of the bonding surface of the ceramic substrate 212 to the metal base plate 216.

Figure 8:
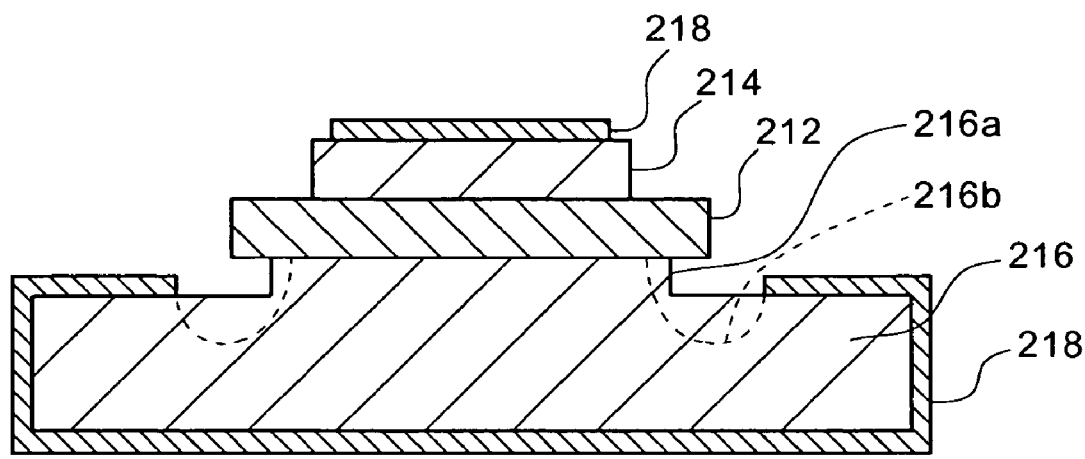
FIG. 8 is a sectional view showing a state that resists are formed for producing the metal/ceramic bonding substrate of FIG. 7.

The metal/ceramic bonding substrate 210 in this preferred embodiment may be produced by, e.g., a method comprising the steps of: using the same mold as the mold 20 shown in FIGS. 2 and 3 in the first preferred embodiment to bond the circuit metal plate 214 to one side of the ceramic substrate 212 and to bond the radiating metal base plate 216 to the other side thereof, by the same method as that in the first preferred embodiment; forming a resist 218 having a shape of a predetermined pattern on the top face of the circuit forming metal plate 214, and a resist 218 on the substantially entire surface of the metal base plate 216 except for a portion near the peripheral portion of the ceramic substrate 212, as shown in FIG. 8; and thereafter, etching the circuit forming metal plate 214 and the metal base plate 216 to form the groove portion 216b in the metal base plate 216.

[Fourth Preferred Embodiment]

Figure 9:
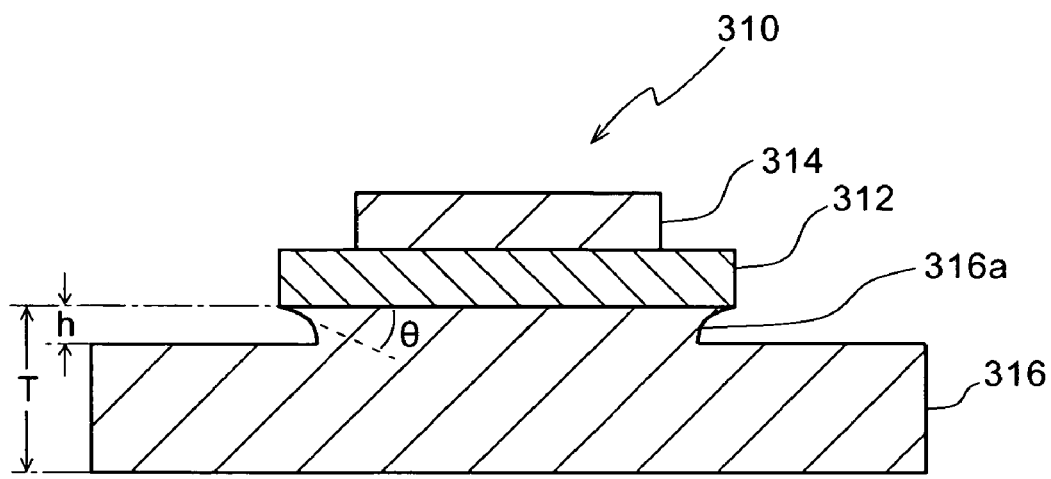
FIG. 9 is a sectional view showing the fourth preferred embodiment of a metal/ceramic bonding substrate according to the present invention.

FIG. 9 shows the fourth preferred embodiment of a metal/ceramic bonding substrate according to the present invention. As shown in FIG. 9, the metal/ceramic bonding substrate 310 in this preferred embodiment has the same shape as that of the metal/ceramic bonding substrate 10 in the first preferred embodiment, except that the shape of the rising portion 16a is changed to the shape of a rising portion 316a, and comprises a substantially rectangular flat-plate-shaped ceramic substrate 312, at least one (only one is shown in FIG. 9) substantially rectangular flat-plate-shaped circuit forming metal plate 314 which is bonded to one side of the ceramic substrate 312 and which is smaller than the ceramic substrate 312, and a radiating metal base plate 316 (thickness T) which is bonded to the other side of the ceramic substrate 312 and which has a substantially rectangular planar shape. In this preferred embodiment, the metal base plate 316 has the rising portion 316a which rises by a predetermined height h from a surface thereof facing the ceramic substrate 312 and which has a substantially rectangular planar shape. To the top face of the rising portion 316a, the ceramic substrate 312 is bonded. The angle θ between the bonding surface of the ceramic substrate 312 to the rising portion 316a and the side face of the rising portion 316a is an acute angle (θ<90°). With this construction, a difference in level is provided along the entire circumference of the bonding surface of the ceramic substrate 312 to the metal base plate 316.

Figure 10:
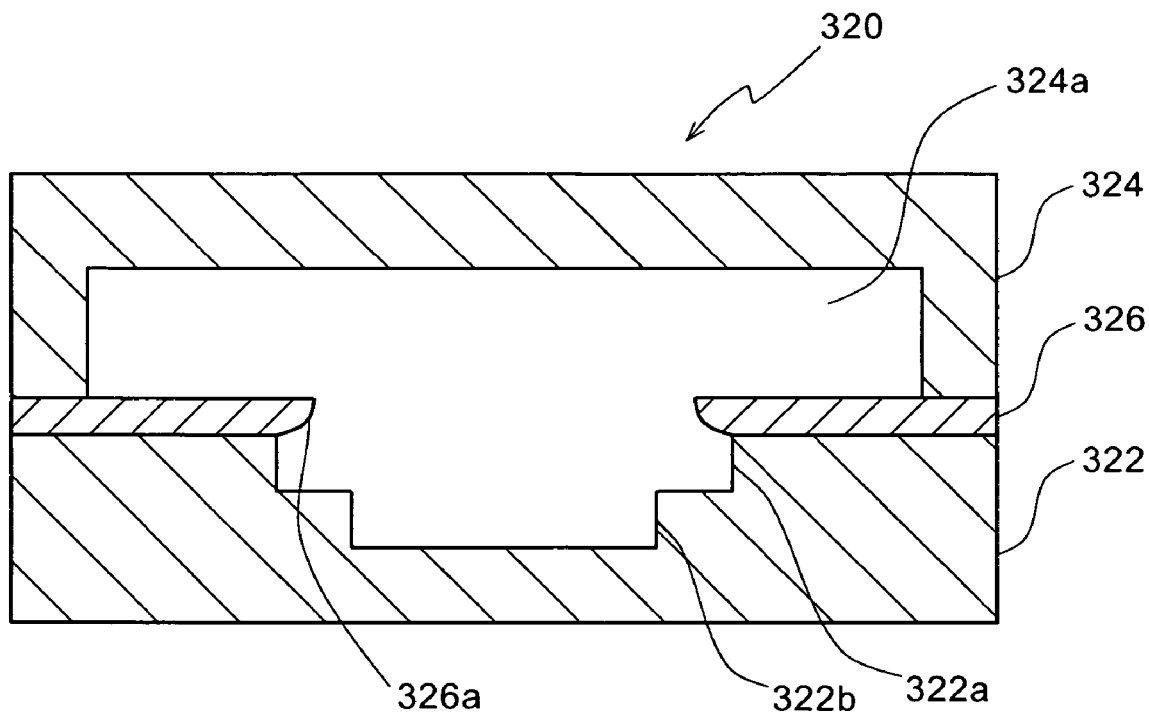
FIG. 10 is a sectional view of a mold used for producing the metal/ceramic bonding substrate of FIG. 9.

Similar to the first preferred embodiment, the metal/ceramic bonding substrate 310 in this preferred embodiment may be produced by, e.g., a method comprising the steps of: preparing a mold 320 shown in FIG. 10; arranging the ceramic substrate 312 in the mold 320; injecting a molten metal into the mold 320 so as to contact both sides of the ceramic substrate 312; and thereafter, cooling and solidifying the molten metal to bond the circuit forming metal plate 314 to one side of the ceramic substrate 312 and to bond the radiating metal base plate 316 to the other side thereof.

As shown in FIG. 10, the mold 320 is the same as the mold 20 shown in FIGS. 2 and 3 except for the shape of a through hole serving as a rising portion forming portion 326a of an intermediate mold member 326, and comprises lower and upper mold members 322 and 324 which have a substantially rectangular planar shape and which are preferably made of a gas permeable material, such as carbon or a porous metal, and the intermediate mold member 326 of a metal material or the like which is arranged between the lower and upper mold members 322 and 324 and which has a substantially rectangular planar shape. In a substantially central portion of the top face of the lower mold member 322, there is formed a recessed portion serving as a ceramic substrate holding portion 322a which substantially has the same shape and size as those of the ceramic substrate 312. In a substantially central portion of the bottom of the ceramic substrate holding portion 322a, there is formed a recessed portion serving as a metal circuit plate forming portion 322b which substantially has the same shape and size as those of the circuit forming metal plate 314. The intermediate mold member 326 comprises two pieces for allowing the metal/ceramic bonding substrate 310 to be taken out of the mold, and has such a shape that a through hole serving as the rising portion forming portion 326a, which substantially has the same shape and size as those of the rising portion 316a, is formed in the substantially central portion when the two pieces are aligned with each other. Although the intermediate mold member 326 is preferably formed of a metal material in view of strength, it may be made of the same carbon or porous metal as that of the lower mold member 322. In the upper mold member 324, there is formed a metal baseplate forming portion 324a which substantially has the same shape and size as those of a portion of the radiating metal base plate 316 other than the rising portion 316a. Furthermore, a molten metal inlet (not shown) for injecting a molten metal into the mold 320 is formed in the upper mold member 324. In the intermediate mold member 326 and lower mold member 322, a molten metal passage (not shown) extending between the metal base plate forming portion 324a and the metal circuit plate forming portion 322b is formed so as to allow the metal base plate forming portion 324a to be communicated with the metal circuit plate forming portion 322b if the ceramic substrate 312 is housed in the ceramic substrate housing portion 322a.

After the ceramic substrate 312 is housed in the ceramic substrate holding portion 322a of the lower mold member 322 of the mold 320, the intermediate mold member 326 is arranged on the lower mold member 322, and the upper mold member 324 is arranged thereon to be fixed. Thereafter, a molten metal, such as molten aluminum, is injected into the metal base plate forming portion 324a to be filled in the metal circuit plate forming portion 322b via the molten metal passage. Then, the molten metal is cooled to be solidified to obtain a metal/ceramic bonding substrate 310 wherein the circuit forming metal plate 314 is bonded directly to one side of the ceramic substrate 312 and the radiating metal base plate 316 is bonded directly to the other side thereof, as shown in FIG. 9. Thereafter, a resist having a shape of a predetermined circuit pattern is formed on the top face of the circuit forming metal plate 314 to etch the circuit forming metal plate 314 to form a metal circuit plate having the predetermined circuit pattern.

[Fifth Preferred Embodiment]

Figure 11:
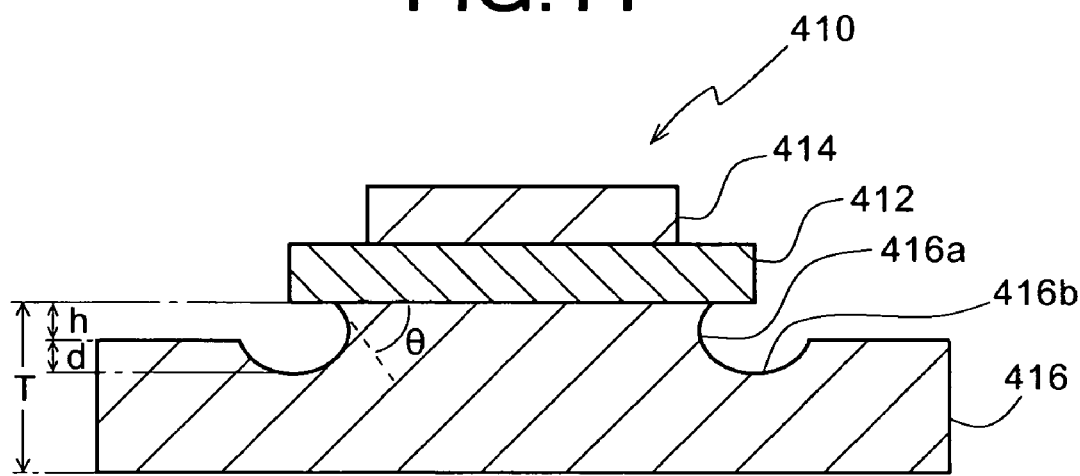
FIG. 11 is a sectional view of the fifth preferred embodiment of a metal/ceramic bonding substrate according to the present invention.

FIG. 11 shows the fifth preferred embodiment of a metal/ceramic bonding substrate according to the present invention. As shown in FIG. 11, the metal/ceramic bonding substrate 410 in this preferred embodiment has such a shape that the metal/ceramic bonding substrate 310 in the fourth preferred embodiment is combined with the metal/ceramic bonding substrate 110 in the second preferred embodiment, and comprises a substantially rectangular flat-plate-shaped ceramic substrate 412, at least one (only one is shown in FIG. 11) substantially rectangular flat-plate-shaped circuit forming metal plate 414 which is bonded to one side of the ceramic substrate 412 and which is smaller than the ceramic substrate 412, and a radiating metal base plate 416 (thickness T) which is bonded to the other side of the ceramic substrate 412 and which has a substantially rectangular planar shape. In this preferred embodiment, the metal base plate 416 has a rising portion 416a which rises by a predetermined height h from a surface thereof facing the ceramic substrate 412 and which has a substantially rectangular planar shape, and a groove portion 416a which extends so as to surround the rising portion 416a and which has a depth d. To the top face of the rising portion 416a, the ceramic substrate 412 is bonded. Similar to the fourth preferred embodiment, the angle θ between the bonding surface of the ceramic substrate 412 to the rising portion 416a and the side face of the rising portion 416a is an acute angle (θ<90°). With this construction, a difference in level is provided along the entire circumference of the bonding surface of the ceramic substrate 412 to the metal base plate 416.

Figure 12:
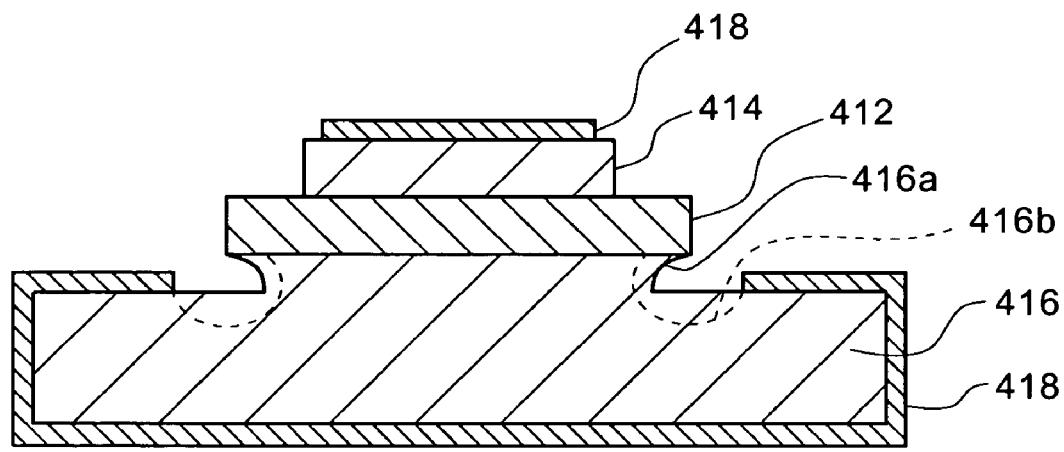
FIG. 12 is a sectional view showing a state that resists are formed for producing the metal/ceramic bonding substrate of FIG. 11.

The metal/ceramic bonding substrate 410 in this preferred embodiment may be produced by, e.g., a method comprising the steps of: using the same mold as the mold 320 shown in FIG. 10 in the first preferred embodiment to bond the circuit metal plate 414 to one side of the ceramic substrate 412 and to bond the radiating metal base plate 416 to the other side thereof, by the same method as that in the fourth preferred embodiment; forming a resist 418 having a shape of a predetermined pattern on the top face of the circuit forming metal plate 414, and a resist 418 on the substantially entire surface of the metal base plate 416 except for a portion near the peripheral portion of the ceramic substrate 412, as shown in FIG. 12; and thereafter, etching the metal base plate 416 to form the groove portion 416b.

While the metal/ceramic bonding substrate has been produced by the molten metal bonding method in the above described first through fifth preferred embodiments, a metal/ceramic bonding substrate according to the present invention may be produced by another method, such as the brazing and soldering method or the direct bonding method. That is, a metal base plate having the same shape as the metal base plate of the metal/ceramic bonding substrate in the above described first through fifth preferred embodiments, and a circuit forming metal plate may be bonded to a ceramic substrate by another method, such as the brazing and soldering method or the direct bonding method.

While the shape of the radiating metal base plate has been the substantially flat plate shape and while the opposite surface (reverse) of the radiating metal base plate to the ceramic substrate has been flat in the above described first through fifth preferred embodiments, a base plate having fins on its reverse, or a water cooling base plate including a water cooling channel may be used as the radiating metal base plate. Such a metal base plate can also obtain the same advantageous effects as those in the above described first through fifth preferred embodiments. While the single circuit forming metal plate has been illustrated in the above-described first through fifth preferred embodiments, the same advantageous effects can be obtained even if a plurality of circuit forming metal plates are used.

EXAMPLE 1

By the same method as the first preferred embodiment of a method for producing a metal/ceramic bonding substrate according to the present invention, three aluminum plates having a thickness of 0.4 mm were bonded to one side of an aluminum nitride substrate having a size of 36 mm×40 mm×0.635 mm so that a so-called creeping distance (a distance between the edge of a surface of the aluminum nitride substrate on the side of the aluminum plate and the edge of the bonding surface of the aluminum plate to the aluminum nitride substrate) D (see FIG. 1B) was 1.5 mm, and an aluminum base plate having a thickness of 5 mm and having a rising portion having a height of 0.4 mm was bonded to the other side of the aluminum nitride substrate, to produce a metal/ceramic bonding substrate having a shape similar to that of the metal/ceramic bonding substrate in the first preferred embodiment. Electrodes were provided on the aluminum plate and aluminum base plate of the metal/ceramic bonding substrate, respectively. Then, the alternating voltage applied between the electrodes in the atmosphere was gradually raised, and a voltage at a leak current of 0.5 mA was measured as a withstand voltage. As a result, the withstand voltage was 2.5 kV or more. In addition, after heat cycles (one cycle: 20° C.×10 minutes→−40° C.×30 minutes→20° C.×10 minutes→125° C.×30 minutes) were repeatedly carried out three thousands times, a crack having a length of 1 mm was produced in the aluminum base plate under the aluminum nitride substrate, and after the same heat cycles were repeatedly carried out five thousands times, a crack having a length of 3 mm was produced therein.

EXAMPLE 2

By the same method as the second preferred embodiment of a method for producing a metal/ceramic bonding substrate according to the present invention, three aluminum plates having a thickness of 0.4 mm were bonded to one side of an aluminum nitride substrate having a size of 36 mm×40 mm×0.635 mm so that the creeping distance was 1.5 mm, and an aluminum base plate having a thickness of 5 mm was bonded to the other side of the aluminum nitride substrate. Then, resists were formed for etching the aluminum base plate to form a groove portion having a depth of 0.5 mm to produce a metal/ceramic bonding substrate having a shape similar to that of the metal/ceramic bonding substrate in the second preferred embodiment. After the withstand voltage of this metal/ceramic bonding substrate was measured by the same method as that in Example 1, the withstand voltage was 2.5 kV or more. In addition, a crack having a length of 1 mm was produced in the aluminum base plate under the aluminum nitride substrate after the same heat cycles as those in Example 1 were repeatedly carried out three thousands times, and a crack having a length of 3 mm was produced therein after the same heat cycles were repeatedly carried out five thousands times.

EXAMPLE 3

By the same method as the third preferred embodiment of a method for producing a metal/ceramic bonding substrate according to the present invention, three aluminum plates having a thickness of 0.4 mm were bonded to one side of an aluminum nitride substrate having a size of 36 mm×40 mm×0.635 mm so that the creeping distance was 1.5 mm, and an aluminum base plate having a thickness of 5 mm and having a rising portion having a height of 0.4 mm was bonded to the other side of the aluminum nitride substrate. Then, resists were formed for etching the aluminum base plate to form a groove portion having a depth of 0.5 mm to produce a metal/ceramic bonding substrate having a shape similar to that of the metal/ceramic bonding substrate in the third preferred embodiment. After the withstand voltage of this metal/ceramic bonding substrate was measured by the same method as that in Example 1, the withstand voltage was 2.5 kV or more. In addition, no crack was observed on the aluminum base plate under the aluminum nitride substrate after the same heat cycles as those in Example 1 were repeatedly carried out three thousands times, and a crack having a length of 1 mm was produced therein after the same heat cycles were repeatedly carried out five thousands times.

EXAMPLE 4

By the same method as the fourth preferred embodiment of a method for producing a metal/ceramic bonding substrate according to the present invention, three aluminum plates having a thickness of 0.4 mm were bonded to one side of an aluminum nitride substrate having a size of 36 mm×40 mm×0.635 mm so that the creeping distance was 1.5 mm, and an aluminum base plate having a thickness of 5 mm and having a rising portion having a height of 0.4 mm was bonded to the other side of the aluminum nitride substrate, to produce a metal/ceramic bonding substrate having a shape similar to that of the metal/ceramic bonding substrate in the fourth preferred embodiment. After the withstand voltage of this metal/ceramic bonding substrate was measured by the same method as that in Example 1, the withstand voltage was 2.5 kV or more. In addition, no crack was observed on the aluminum base plate under the aluminum nitride substrate after the same heat cycles as those in Example 1 were repeatedly carried out three thousands times, and a crack having a length of 1 mm was produced therein after the same heat cycles were repeatedly carried out five thousands times.

EXAMPLE 5

By the same method as the fifth preferred embodiment of a method for producing a metal/ceramic bonding substrate according to the present invention, three aluminum plates having a thickness of 0.4 mm were bonded to one side of an aluminum nitride substrate having a size of 36 mm×40 mm×0.635 mm so that the creeping distance was 1.5 mm, and an aluminum base plate having a thickness of 5 mm and having a rising portion having a height of 0.4 mm was bonded to the other side of the aluminum nitride substrate. Then, resists were formed for etching the aluminum base plate to form a groove portion having a depth of 0.5 mm to produce a metal/ceramic bonding substrate having a shape similar to that of the metal/ceramic bonding substrate in the fifth preferred embodiment. After the withstand voltage of this metal/ceramic bonding substrate was measured by the same method as that in Example 1, the withstand voltage was 2.5 kV or more. In addition, no crack was observed on the aluminum base plate under the aluminum nitride substrate after the same heat cycles as those in Example 1 were repeatedly carried out three thousands times, and no crack was also observed thereon after the same heat cycles were repeatedly carried out five thousands times.

EXAMPLE 6

By the same method as that in Example 3, except that the thickness of the aluminum nitride substrate was 0.3 mm, a metal/ceramic bonding substrate having a shape similar to that of the metal/ceramic bonding substrate in the third preferred embodiment was produced. After the withstand voltage of this metal/ceramic bonding substrate was measured by the same method as that in Example 1, the withstand voltage was 2.5 kV or more. In addition, no crack was observed on the aluminum base plate under the aluminum nitride substrate after the same heat cycles as those in Example 1 were repeatedly carried out three thousands times, and a crack having a length of 1 mm was produced therein after the same heat cycles were repeatedly carried out five thousands times.

COMPARATIVE EXAMPLE

Figure 13:
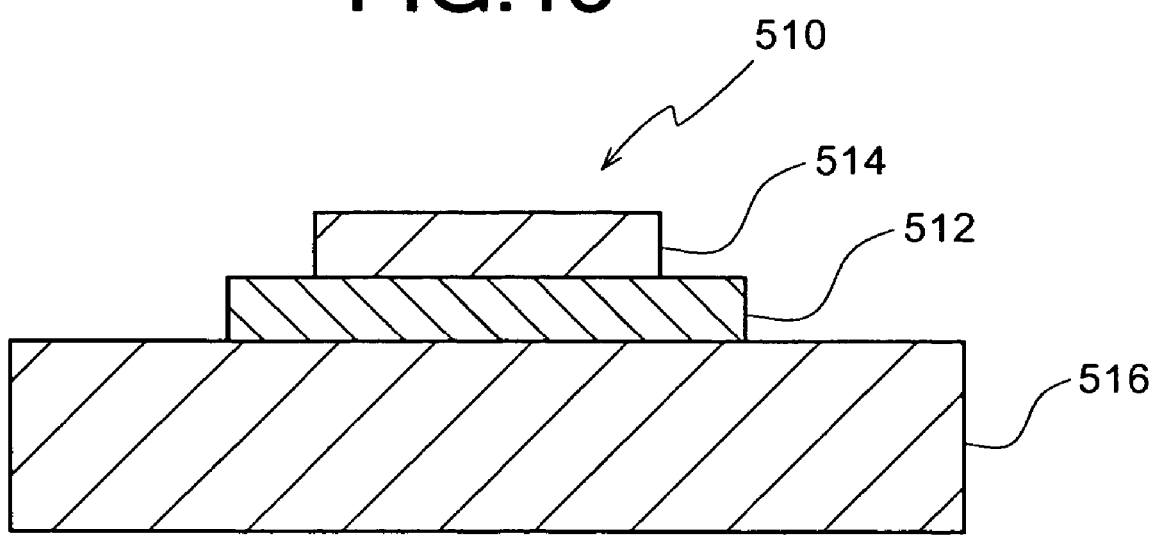
FIG. 13 is a sectional view of a metal/ceramic bonding substrate produced in a comparative example.

By the molten metal bonding method similar to Examples 1 through 6, a mold shown in FIG. 5 was used for bonding three aluminum plates 514 (only one aluminum plate 514 is shown in FIG. 13) having a thickness of 0.4 mm to one side of an aluminum nitride substrate 512 having a size of 36 mm×40 mm×0.635 mm, and an aluminum base plate 516 having a thickness of 5 mm to the other side thereof, as shown in FIG. 13. After the withstand voltage of the metal/ceramic bonding substrate thus obtained was measured by the same method as that in Example 1, the withstand voltage was less than 2.0 kV. In addition, a crack having a length of 3 mm was produced in the aluminum base plate under the aluminum nitride substrate after the same heat cycles as those in Example 1 were repeatedly carried out three thousands times.

Thus, the withstand voltage was only less than 2.0 kV in Comparative Example, whereas the withstand voltage was 2.5 kV or more in Examples 1 through 6. In addition, in Comparative Example, the crack having the length of 3 mm was produced in the aluminum base plate under the aluminum nitride substrate after 3000 heat cycles. However, in Examples 1 and 2, the length of the crack was only 1 mm after 3000 heat cycles, and in Examples 3 through 6, no crack was observed after 3000 heat cycles. Moreover, in Examples 1 and 2, the length of the crack did not reach 3 mm unless the heat cycles were repeatedly carried out five thousands times. In Examples 3, 4 and 6, the length of the crack was only 1 mm after 5000 heat cycles, and in Example 5, no crack was observed after 5000 heat cycles.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A metal/ceramic bonding substrate comprising:
    a ceramic substrate
    a metal plate bonded to one side of the ceramic substrate; and
    a metal base member having a bonding surface which is bonded to the other side of the ceramic substrate, said bonding surface having a circumference and a smaller area than that of the other side of the ceramic substrate, wherein difference in level is provided along the entire circumference of the bonding surface of the metal base member.

2. A metal/ceramic bonding substrate as set forth in claim 1, wherein said bonding surface is a top surface of a rising portion which rises toward said ceramic substrate.

3. A metal/ceramic bonding substrate as set forth in claim 1, wherein said bonding surface is surrounded by a groove portion formed in said metal base member.

4. A metal/ceramic bonding substrate as set forth in claim 1, wherein said bonding surface is a top surface of a rising portion which rises toward said ceramic substrate, said rising portion being surrounded by a groove portion formed in said metal base member.

5. A metal/ceramic bonding substrate as set forth in claims 2 or 4, wherein said rising portion rises in a direction substantially perpendicular to said ceramic substrate.

6. A metal/ceramic bonding substrate as set forth in claims 3 or 5, wherein said rising portion rises at an acute angle with respect to said ceramic substrate.

7. A metal/ceramic bonding substrate comprising:
a ceramic substrate;
a metal plate bonded to one side of the ceramic substrate; and
a metal base member comprising a flat plate portion and a rising portion which rises from said flat plate portion, said rising portion having a bonding surface which is bonded to the other side of said ceramic substrate and said bonding surface has a smaller area than that of the other side of said ceramic substrate.

8. A metal/ceramic bonding substrate comprising:
a ceramic substrate;
a metal plate bonded to one side of the ceramic substrate; and
a metal base member having a bonding surface which is bonded to the other side of the ceramic substrate and said bonding surface has a smaller area than that of the other side of the ceramic substrate, said bonding surface being surrounded by a groove portion which is formed in the metal base member.

9. A metal/ceramic bonding substrate as set forth in claim 8, wherein said groove portion extends along the entire periphery of said ceramic substrate.

10. A metal/ceramic bonding substrate comprising:
a ceramic substrate;
a metal plate bonded to one side of the ceramic substrate; and
a metal base member comprising a flat plate portion and a rising portion which rises from said flat plate portion, said rising portion having a bonding surface which is bonded to the other side of said ceramic substrate and said bonding surface has a smaller area than that of the other side of said ceramic substrate,
said rising portion being surrounded by a groove portion which is formed in said metal base member.

11. A metal/ceramic bonding substrate as set forth in claim 10, wherein said groove portion extends so as to surround the entire periphery of said rising portion.

12. A metal/ceramic bonding substrate as set forth in claims 8 or 11, wherein said rising portion rises from said flat plate portion in a direction substantially perpendicular thereto.

13. A metal/ceramic bonding substrate as set forth in claims 8 or 11, wherein said rising portion rises at an acute angle with respect to said ceramic substrate.

14. A metal/ceramic bonding substrate comprising:
a ceramic substrate;
a metal plate bonded to one side of the ceramic substrate; and
a metal base member having a rising portion which rises at an acute angle with respect to said ceramic substrate and which is bonded to the other side of the ceramic substrate,
wherein a difference in level is provided along and entire circumference of a bonding surface of the metal base member.

15. A metal/ceramic bonding substrate as set forth in claim 14, wherein said bonding surface is a top surface of a rising portion which rises toward said ceramic substrate.

16. A metal/ceramic bonding substrate as set forth in claim 14, wherein said bonding surface is surrounded by a groove portion formed in said metal base member.

17. A metal/ceramic bonding substrate as set forth in claim 14, wherein said bonding surface is a top surface of a rising portion which rises toward said ceramic substrate, said rising portion being surrounded by a groove portion formed in said metal base member.

18. A metal/ceramic bonding substrate comprising:
a ceramic substrate;
a metal plate bonded to one side of the ceramic substrate; and
a metal base member comprising a flat plate portion and a rising portion which rises from said flat plate portion at an acute angle with respect to said ceramic substrate, said rising portion being bonded to the other side of said ceramic substrate.

* * * * *